United States Patent [19]
Sato et al.

[11] Patent Number: 4,835,065
[45] Date of Patent: May 30, 1989

[54] COMPOSITE ALUMINA-ALUMINUM NITRIDE CIRCUIT SUBSTRATE

[75] Inventors: Hideki Sato; Nobuyuki Mizunoya, both of Yokohama, Japan

[73] Assignee: Kabushiki Kaisha Toshiba, Kawasaki, Japan

[21] Appl. No.: 71,134

[22] Filed: Jul. 8, 1987

[30] Foreign Application Priority Data

Jul. 11, 1986 [JP] Japan .................. 61-161783

[51] Int. Cl.[4] ............................................. B32B 15/04
[52] U.S. Cl. ...................................... 428/622; 428/627; 428/662; 428/663; 428/665; 428/674; 428/901; 357/67; 357/71
[58] Field of Search ............... 428/620, 622, 627, 632, 428/662, 663, 665, 674, 680, 901; 357/67, 71

[56] References Cited

U.S. PATENT DOCUMENTS

| | | | |
|---|---|---|---|
| 3,457,052 | 7/1969 | Carlson et al. | 29/199 |
| 4,480,013 | 10/1984 | Doi et al. | 428/616 |
| 4,580,714 | 4/1986 | Mayer et al. | 228/121 |
| 4,591,537 | 5/1986 | Aldinger et al. | 428/698 |
| 4,761,345 | 8/1988 | Sato et al. | 428/627 |
| 4,770,953 | 9/1988 | Horiguchi et al. | 428/901 |

FOREIGN PATENT DOCUMENTS

| | | |
|---|---|---|
| 0114193 | 8/1984 | European Pat. Off. |
| 0142673 | 5/1985 | European Pat. Off. |
| 0153737 | 9/1985 | European Pat. Off. |
| 2338230 | 2/1974 | Fed. Rep. of Germany |
| 3316807 | 11/1984 | Fed. Rep. of Germany |
| 61-7647 | 1/1986 | Japan |
| 1387478 | 3/1975 | United Kingdom |

OTHER PUBLICATIONS

R. A. Jarvela, IBM Technical Disclosure Bulletin, "Low-Cost, Large-Scale Integration Single Chip Module Package", vol. 18, No. 11, Apr. 1976.

Nobuyuki Mizunoya, Patent Abstracts of Japan, "Circuit Substrate", vol. 10, No. 145 (E-407) [2202], May 28, 1986.

H. Takashio, "Alumina Ceramic-to-Metal Seals by the Mo-Mn Process Yogyo-Kyokai-Shi", 79(9)1971, pp. 330–339.

*Primary Examiner*—L. Dewayne Rutledge
*Assistant Examiner*—George Wyszimiersmi
*Attorney, Agent, or Firm*—Foley, Lardner, Schwartz, Jeffery, Schwaab, Mack, Blumenthal & Evans

[57] ABSTRACT

Disclosed is a circuit substrate comprising an alumina plate and an aluminum nitride plate bonded to the alumina plate through metallized layers formed on the respective bonding surfaces of the alumina plate and the aluminum nitride plate and a buffering layer provided between the metallized layers, the buffering layer being of a metallic material (a) which undergoes plastic deformation by recrystallization at a temperature of not higher than 500° C., (b) which has a tensile strength of not higher than 35 kg.f/mm$^2$ at a temperature of 500° C., and (c) which has an elongation of not less than 10% at a temperature of 500° C.

The circuit substrate of this invention can provide a circuit substrate being excellent in heat dissipating characteristic and free from the generation of crack on an operation.

18 Claims, 3 Drawing Sheets ns. $H_2O$

COMPOSITE ALUMINA-ALUMINUM NITRIDE CIRCUIT SUBSTRATE

BACKGROUND OF THE INVENTION

This invention relates to a circuit substrate, more particularly, to a hybrid-type circuit substrate comprising an alumina plate and, bonded thereto an aluminum nitride plate which exhibits an excellent heat dissipating characteristic, being free from generation of crack and the like at the bonded portions of these plates.

As a circuit substrate, there has generally been employed an inexpensive alumina ($Al_2O_3$) substrate, on which a circuit is formed and various elements including a semiconductor device is mounted.

However, in recent years, with the larger output of a semiconductor device, generation of heat from the device has become larger and the above-mentioned $Al_2O_3$ substrate causes a problem in that it is not necessarily satisfactory with respect to the heat dissipation.

In order to solve the problem, an aluminum nitride (AlN) substrate having an excellent heat dissipating property may be employed in place of the $Al_2O_3$ substrate for constituting a circuit substrate. However, since the former is much more expensive than the latter, it can not be said that the former is suitable in practical use.

Then, it has recently been tried to improve the heat dissipation from an element and reduce the cost thereof by preparing a circuit substrate with an $Al_2O_3$ plate in combination with an AlN plate and placing, only on the AlN plate, an element which exhibits particularly larger heat generation (see Japanese Provisional Patent Publication (KOKAI) No. 7647/1986).

As the construction of such hybrid-type circuit substrate, there may be mentioned a construction as shown in FIG. 1 in which an aperture portion 1a is arranged at a desired portion of an $Al_2O_3$ plate 1, an AlN plate 2 having a shape corresponding to the aperture portion 1a is fixed therein, and the side faces of the AlN plate 2 is bonded to the inner wall faces of the aperture portion 1a; a construction as shown in FIG. 2 in which, onto a peripheral portion around an aperture portion 1a on an under surface of an $Al_2O_3$ plate 1, a peripheral portion of a surface of an AlN plate 2 is bonded; etc.

Also, when plates of ceramics including $Al_2O_3$ and AlN are to be bonded to each other, metallization and soldering are usually conducted preliminarily before bonding. However, as disclosed in KOKAI No. 7647/1986 and EP-0142673 Al, a ceramic plate is bonded via a buffering layer to another ceramic plate or a metal plate without any metallized and soldered layers.

However, it was found by the present inventors that, since a stress is caused at the time of use due to the difference between the thermal expansion coefficient of $Al_2O_3$ and that of AlN, cracks are sometimes caused at the bonded portion and, in particular case, the AlN plate falls off and when the circuit substrate has been hermetically sealed to form a package, the reduction of airtightness thereof is inconveniently caused.

As mentioned above, it was experimentally proved that the $Al_2O_3$/AlN hybrid-type circuit substrate tends to generate crack in use due to the difference of the thermal expansion coefficients of both plates.

SUMMARY OF THE INVENTION

An object of this invention is to solve such problems and to provide an $Al_2O_3$/AlN hybrid-type circuit substrate which is constructed by bonding an AlN plate on part of an $Al_2O_3$ plate and generates no cracks at the bonded portion during use.

The present inventors have extensively focused their attention on the structure of the bonded portion of $Al_2O_3$ and AlN plates. As a result, they discovered that a metallic layer acting as a buffering layer which absorbs the stress caused by the difference of the thermal expansion coefficients of both plates may be provided between the respective portions to be bonded, and found the conditions such metallic material should satisfy to accomplish this invention.

More specifically, the circuit substrate of this invention is a circuit substrate comprising an alumina plate and an aluminum nitride plate bonded to said alumina plate through metallized layers formed on the respective bonding surfaces of said alumina plate and said aluminum nitride plate and a buffering layer provided between said metallized layers, said buffering layer being of a metallic material (a) which undergoes plastic deformation by recrystallization at a temperature of not higher than 500° C., (b) which has a tensile strength of not higher than 35 kg·f/$mm^2$ at a temperature of 500° C., and (c) which has an elongation of not less than 10% at a temperature of 500° C.

DESCRIPTION OF THE PREFERRED EMBODIMENTS

In the above-mentioned conditions (a) to (c) which the metallic material of this invention should satisfy, concerning (b), if the tensile strength exceeds 35 kg·f/$mm^2$, it becomes larger than the bending strength of the $Al_2O_3$ plate and that of the AlN plate to cause cracks on these plates. Also, the tensile strength of the metallic material is preferably not less than 2 kg·f/$mm^2$ at a room temperature. If the tensile strength is less than 2 kg·f/$mm^2$, cracks are caused on the metallic material at room temperature, in cases where the two ceramic plates are bonded to each other via metallized layers and soldering layers.

Concerning the condition (c), if the elongation at a temperature of 500° C. is less than 10%, cracks tend to form at the bonded portion at the time of heat generation from the element. Also, the elongation of the metallic material is preferably not more than 50% at a temperature of 500° C. If the elongation exceeds 50%, cracks form at the bonded portion.

Figure 1:
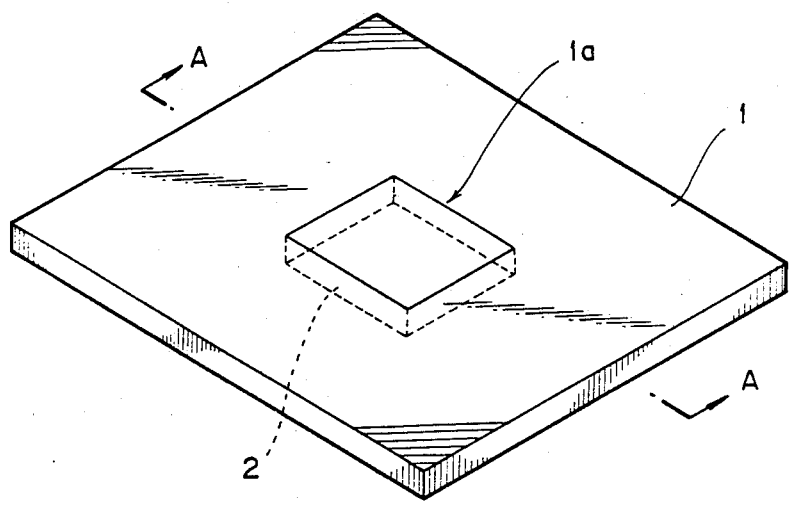
FIGS. 1 and 2 are perspective views showing examples of circuit substrates of this invention, respectively.
Figure 2:
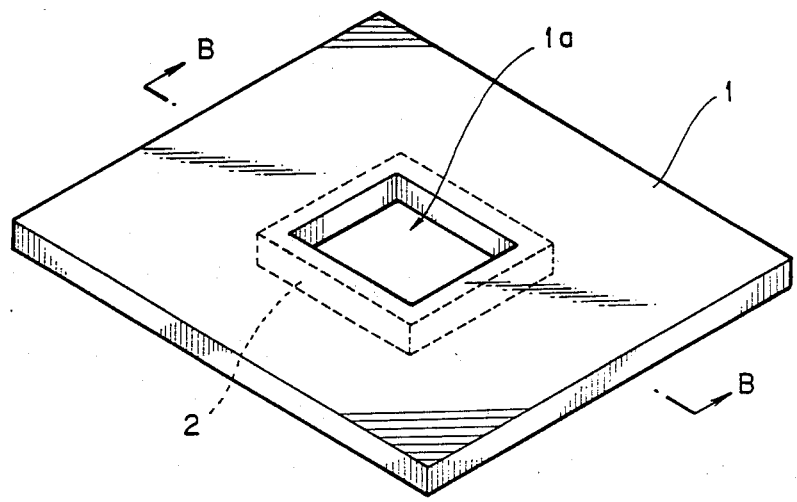

As mentioned above, this invention is characterized by the structure at the bonded portion of an $Al_2O_3$ plate and an AlN plate and should not be limited by the shape or form of the plates. Specifically, as the structure, there may be mentioned, for example, those as shown in FIGS. 1 and 2. However, the AlN plate or plates may be arranged not only on one place, but also on several places of the Al$_2$O$_3$ plate and not only on the central place of the Al$_2$O$_3$ plate, but also on the peripheral place.

Figure 3:
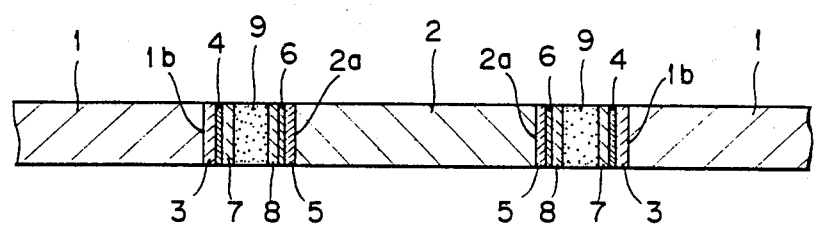
FIG. 3 is a cross-sectional view along the line A—A of FIG. 1.

FIG. 3 shows a cross-sectional view of the bonded portion of the circuit substrate shown in FIG. 1. In this circuit substrate, both plates are bonded by fixing the AlN plate 2 in the aperture portion 1a of Al$_2$O$_3$ plate 1 (shown in FIG. 1). Since the AlN plate is employed for the purpose of the improvement of the heat dissipating characteristic, it is preferred to use AlN having a thermal conductivity of not less than 50 W/m·k. The structure of the bonded portion will be explained in detail hereinbelow. Firstly, on an inner wall face 1b of the aperture portion 1a of the Al$_2$O$_3$ plate 1, a metallized layer 3 and a plating layer 4 are formed in that order. The metallized layer 3 may be constituted of molybdenum (Mo), tungsten (W), etc. and formed by employing the conventional metallizing method as described in "Alumina Ceramic-to-Metal Seals by the Mo-Mn Process", Yogyo-Kyokai-Shi, 79(9)1971, pp 330–339, H. TAKASHIO, etc. While the material for the plating layer 4 is not particularly limitative, there may be employed the conventional nickel (Ni) plating etc. On the other hand, also on the side face 2a of the AlN plate 2, a metallized layer 5 and a plating layer 6 are formed. The inner wall face 1b and the side face 2a which are provided with the metallized layers thereon are facing each other and bonded through soldering layers 7 and 8 formed by, for example, silver soldering, high temperature soldering, etc. and a buffering layer 9 between the respective metallized layers 4 and 6. The buffering layer 9 being an essential part of this invention is constituted of a metallic material satisfying all of the above mentioned conditions (a) to (c). If these conditions are not completely satisfied, the buffering function is not sufficiently exhibited and cracks sometimes form.

As the specific material for the buffering layer, there may be mentioned, for example, a nickel series alloy (as the commercially available product, there may be mentioned, for example, DNT and NICKEL 223; both are trade name of Toshiba K.K. and have a tensile strength of 33 kg·f/mm$^2$ at 500° C. and an elongation of 40% at 500° C.); a chromium series alloy [as the commercially available product, there may be mentioned, for example, PCV-K (trade name of Toshiba K.K.) having a tensile strength of 35 kg·f/mm$^2$ at 500° C. and an elongation of 35% at 500° C.) and AISI (American Iron and Steel Institute) 430Ti]; a copper series alloy such as phosphor bronze (i.e. those containing 3 to 5.5% of Sn, 0.03 to 0.35% of phosphor and copper as a balance and having a tensile strength of about 25 kg·f/mm$^2$ at 500° C. and an elongation of about 38% at 500° C.), beryllium copper, brass; copper; a clad metal of an iron-nickel-cobalt alloy for hermetic sealing and copper (as the commercially available product, there may be mentioned, for example, KOV-Cu clad metal; "KOV" is a trade name of Toshiba K.K.); Mo-Cu clad metal; W-Cu clad metal; etc.

The metallic material for the buffering layer is more effective in improving its function, if it satisfies the two conditions, i.e., (d) and (e);

(d) the metallic material has a thermal conductivity of not less than 50 W/m·k, (e) it has a thermal expansion coefficient of $2 \times 10^{-6}$ to $9 \times 10^{-6}$/°C., preferably $4 \times 10^{-6}$ to $7 \times 10^{-6}$/°C., most preferably approximately the center value of thermal extension coefficient of Al$_2$O$_3$ and that of AlN, in addition to the conditions (a) to (c). Be noted that the thermal expansion coefficient of AlN is $4 \times 10^{-6}$/°C. and that of Al$_2$O$_3$ is $7 \times 10^{-6}$/°C.

As the metallized layer on the AlN plate, preferably employed is a conductive metallized layer containing:

(i) at least one of element selected from the first group consisting of molybdenum, tungsten and tantalum; and (ii) at least one element selected from the second group consisting of IIb group elements, IIIa and IIIb group elements, IVb group elements, and rare-earth elements, in periodic law table.

In the above elements of the conductive metallized layer, the elements belonging to the first group of molybdenum (Mo), tungsten (W) and tantalum (Ta) are excellent in heat resistance and further approximate to the AlN material in thermal expansion coefficient, so that these elements serve to improve the heat resistance characteristics and the cyclic heat resistance characteristics.

These elements are included in a filler of the metallized layer as a single element or a combination of two or more elements. In more detail, these elements belonging to the first group exist in the metallized layer in the form of each element, a compound or solid solution including each element, or a mixture of two or more elements selected from the group consisting of these elements, compounds and solid solutions. The compounds are oxides, nitrides, carbides, acid nitrides, carbonic nitrides, carbonic oxides, carbonic acid nitrides, borides, silicides, etc. of these elements. In addition to the above-mentioned elements, these compounds can be composite compounds or solid solutions which include at least one of elements belonging to the second group (described later) and/or at least one of elements other than those belonging to the second group.

That is when taking the case of Mo as the element, Mo exists in the conductive metallized layer in the form of Mo or Mo-Al solid solution.

Further, in the elements of the conductive metallized layer, the elements belonging to the second group of the IIIa group elements (B, Al, Ga, In, Tl), the IVb group elements (Ti, Zr, Hf), IIIb group elements (Sc, Y, Te), and the rare earth elements (Y, La, Ce, Pr, Nd, Pm, Sm, Eu, Gd, Tb, Dy, Ho, Er, Tm, Yb, Lu) are excellent in wetness relative to AlN, so that these elements serve to improve the adhesion between the conductive metallized layer and the AlN plate. Further, Al, Ti, Zr, Hf, Y, Ce, Dy, Th, Sm are particularly preferable as the elements belonging to the second group.

In the same way as in the elements belonging to the first group, these elements belonging to the second group are included in the metallized layer in the form of a single element or a mixture of two or more elements. That is, these elements exist in the metallized layer in the form of each element, a compound or solid solution including each element or a mixture of two or more elements selected from the group consisting of these elements, compounds and solid solutions.

In the case of Ti as the component phase, Ti exists in the conductive metallized layer in the form of TiN, TiO$_2$, etc.

In this invention, the composition ratio of elements belonging to the first group and those belonging to the second group is not defined specifically. The ratio is appropriately determined according to the kind of elements used or the combination. For instance, it is preferable that the ratio of the sum total of the elements belonging to the first group to that of the elements belonging to the second group is 90:10 to 10:90 in atomic ratio.

Figure 4:
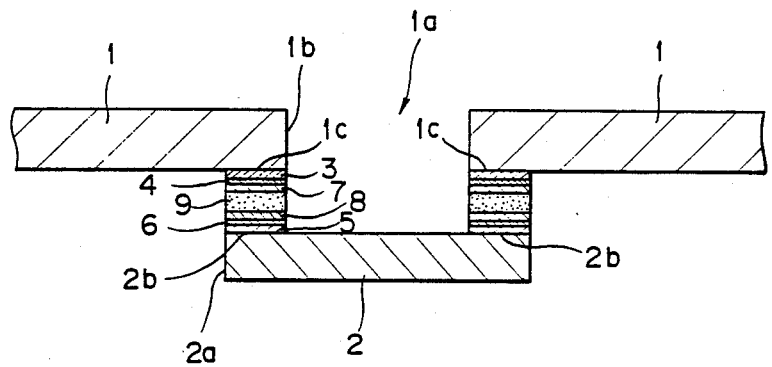
FIG. 4 is a cross-sectional view along the line B—B of FIG. 2.

On the other hand, FIG. 4 shows a cross-sectional view of the bonded portion of the circuit substrate shown in FIG. 2. In FIG. 4, the bonded portion has the same structure as that shown in FIG. 3 except for changing the bonded portions 1b of the Al$_2$O$_3$ plate 1 to the peripheral portion 1c around the aperture portion 1a on an under surface of the Al$_2$O$_3$ plate and changing the bonded portion 2a of the AlN plate 2 to the peripheral portion 2b on a surface of the AlN plate. The specific example of the metallic material for the buffering layer is the same as in the above-mentioned.

The thickness of the buffering layer may usually be more than 0.1 mm and less than 1.0 mm, preferably in the range of 0.1 to 0.5 mm, more preferably 0.2 to 0.4, and most preferably substantially 0.3 mm.

Here, the relation between the thickness of the buffering layer and the thermal expansion coefficient will be described. For example, when employing copper as the buffering layer, since the thermal expansion coefficient of copper ($7.3 \times 10^{-6}/°C$.) is near to that of Al$_2$O$_3$, if the thickness of the buffering layer is not less than 0.1 mm, a stress tends to be applied to the Al$_2$O$_3$ plate to cause cracks thereon rather than on the AlN plate. On the contrary, if the thickness of the buffering layer is not less than 1.0 mm, a stress tends to be applied to the AlN plate to cause cracks thereon rather than on the Al$_2$O$_3$ plate.

Figure 5:
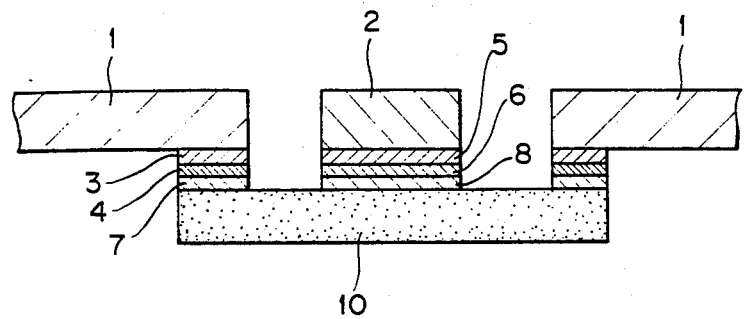
FIG. 5 is a cross-sectional view of other embodiment of this invention.

As the other embodiment of this invention, the circuit substrate shown in FIG. 5 may be mentioned. In this figure, 1 shows an Al$_2$O$_3$ plate, 2 an AlN plate, 10 a buffering layer, the buffering layer 10 and the Al$_2$O$_3$ plate 1 are bonded through metallized layers 3 and 7 and a plating layer 4, and the buffering layer 10 and the AlN plate 2 are bonded through metallized layers 5 and 8 and a plating layer 6.

In such circuit substrate of this invention, sufficient heat dissipating effect can be obtained, even if a semiconductor element exhibiting particularly large heat release value are mounted on the AlN plate. Moreover, since the buffering layer is interposed between the bonded portions of the AlN and Al$_2$O$_3$ plates, if the temperature at the bonded portion is raised due to the generation of heat in the element, the buffering layer can absorb the stress generated due to the difference between the thermal expansion coefficient of Al$_2$O$_3$ and that of AlN to inhibit the generation of cracks, etc.

Incidentally, the circuit substrate as shown in FIG. 1 or 3 is prepared by, for example, forming a metallized layer and a plating layer on the respective bonding portions of the Al$_2$O$_3$ and AlN plates, fixing the AlN plate in the Al$_2$O$_3$ plate with a slight gap, inserting a soldering layer, a buffering layer and a soldering layer in the order into the slight gap and heating thus-obtained substrate to melt the soldering layers and the buffering layer and complete the bonding.

EXAMPLE 1

Firstly, circuit substrate as shown in FIGS. 1 and 3 was prepared. That is, an aperture portion 1a having a size of 20 mm×20 mm was made at the center of an Al$_2$O$_3$ plate 1 having a size of 50 mm×50 mm and a thickness of 0.5 mm. In the aperture portion 1a, an AlN plate 2 having a size slightly smaller than the aperture portion 1a was fixed and bonded. That is, on the respective faces 1b and 2a to be bonded, metallized layers of molybdenum 3 and 5 and nickel plating layers 4 and 6 were respectively formed. Then, these plates were bonded through silver soldering layers 7 and 8 and a buffering layer of oxygen free copper 9 having a thickness of 0.3 mm.

Using the thus obtained circuit substrates, packages were prepared by mounting Si chip on the AlN plate 2 through a metallized layer, forming a circuit thereon by the conventional method and hermetically sealing the whole body of the circuit substrate. Then, 100 packages were prepared in the same manner. An observation was made on 100 bodies of these packages to find that not one formed cracks at the bonded portions of the Al$_2$O$_3$ and AlN plates.

For comparison, circuit substrates and their packages were prepared in the same manner except for not interposing the buffering layer and the same observation was made to reveal the generation of cracks on 90 bodies among 100 bodies.

EXAMPLE 2

Firstly, circuit substrate as shown in FIGS. 2 and 4 was prepared. That is, an aperture portion 1a of 20 mm×20 mm was made at the center of an Al$_2$O$_3$ plate 1 having a size of 50 mm×50 mm and being 0.635 mm in thickness, having a thermal expansion coefficient of 20 W/m·k. To the peripheral portion 1c around the aperture portion 1a on the under surface of the Al$_2$O$_3$ plate, an AlN plate 2 having a thermal expansion coefficient of 150 W/m·k was bonded. On the respective faces 1c and 2b to be bonded, metallized layers of molybdenum 3 and 5 and nickel plating layers 4 and 6 were respectively formed. Then these plates were bonded through silver soldering layers 7 and 8 and a buffering layer of oxygen free copper 9 having a thickness of 0.3 mm.

In this Example, 7 kinds of the circuit substrates having different thicknesses as shown in Table 1 were prepared. For comparison, circuit substrates bonded through metallized layers and plating layers without providing a buffering layer was prepared.

Using the thus obtained circuit substrates, packages were prepared by mounting Si chips on the AlN plate 2 through a metallized layer, forming a circuit thereon by the conventional method and hermetically sealing the whole body. Then, 100 packages of the respective circuit substrates were prepared in the same manner.

The same observation as in Example 1 was conducted immediately after the preparation of these packages, after 200 cycles of TCT (Thermal Cycle Test) by setting −50° C.×0.5 hour and 125° C.×0.5 hours as one cycle and after 500 cycles of TCT as in the above. The results are also shown in Table 1 by indicating the number of circuit substrates in which generation of cracks was confirmed per 100 bodies.

TABLE 1

| Thickness of buffering layer (mm) | Evaluation at the initial stage | After 200 cycles of TCT | After 500 cycles of TCT |
| --- | --- | --- | --- |
| 0.01 | 16 | 52 | 68 |
| 0.05 | 0 | 0 | 0 |
| 0.1 | 0 | 0 | 0 |
| 0.3 | 0 | 0 | 0 |
| 0.5 | 0 | 0 | 0 |
| 0.9 | 0 | 0 | 0 |
| 1.0 | 38 | 70 | 81 |

TABLE 1-continued

| Thickness of buffering layer (mm) | Evaluation at the initial stage | After 200 cycles of TCT | After 500 cycles of TCT |
| --- | --- | --- | --- |
| None | 90 | 100 | 100 |

COMPARATIVE EXAMPLE 1

The same packages were prepared as in Example 1 except for employing a Ni-Cr alloy having a tensile strength of 60 kg·f/mm$^2$ at 500° C. and an elongation of 35% at 500° C. as a metallic material.

On the other hand, the same packages were prepared as in Example 1 except for employing a Cu-Cr-Zr alloy having a tensile strength of 30 kg·f/mm$^2$ at 500° C. and an elongation of 7% at 500° C. as a metallic material.

The same tests and observations as in Example 2 were conducted for these samples. The results are shown in Table 2 by indicating the number of circuit substrates of which generation of crack was confirmed per 100 bodies.

TABLE 2

| Kinds of the metal material | Evaluation at the initial stage | After 200 cycles of TCT | After 500 cycles of TCT |
| --- | --- | --- | --- |
| Ni—Cr alloy | 61 | 73 | 76 |
| Cu—Cr—Zr alloy | 48 | 82 | 82 |

COMPARATIVE EXAMPLE 2

The same packages were prepared as in Example 2 except for employing the following metallic materials as a buffering layer:

(1) a 6% Cu-Al alloy layer of 0.3 mm in thickness having an elongation of 8% at 500° C.

(2) a silica bronze layer (Cu-Si-Sn alloy, the total weight percentage of these three components is not less than 95% by weight) of 0.3 mm in thickness having a tensile strength of 20 kg·f/mm$^2$ at 500° C. and an elongation of 55% at 500° C.

(3) an aluminum bronze layer of 0.3 mm in thickness having a tensile strength of 40 kg·f/mm$^2$ at 500° C. and an elongation of 60% at 500° C.

(4) an indium layer of 0.3 mm in thickness having a tensile strength of 1 kg·f/mm$^2$ at a room temperature.

The same tests and observations as in Example 2 were conducted for these samples. The results are shown in Table 3 by indicating the number of circuit substrates in which generation of cracks was confirmed per 100 bodies. However, the packages employing indium as a buffering layer (shown in the above 4) were all revealed to cause generation of cracks on an indium layer when a slight tensile force was applied to the circuit substrate in the vertical direction.

TABLE 3

| Kinds of the metal material | Evaluation at the initial stage | After 200 cycles of TCT | After 500 cycles of TCT |
| --- | --- | --- | --- |
| (1) 6% Cu—Al alloy | 12 | 15 | 19 |
| (2) silica bronze | 63 | 72 | 75 |
| (3) aluminum bronze | 32 | 45 | 48 |

COMPARATIVE EXAMPLE 3

Figure 6:
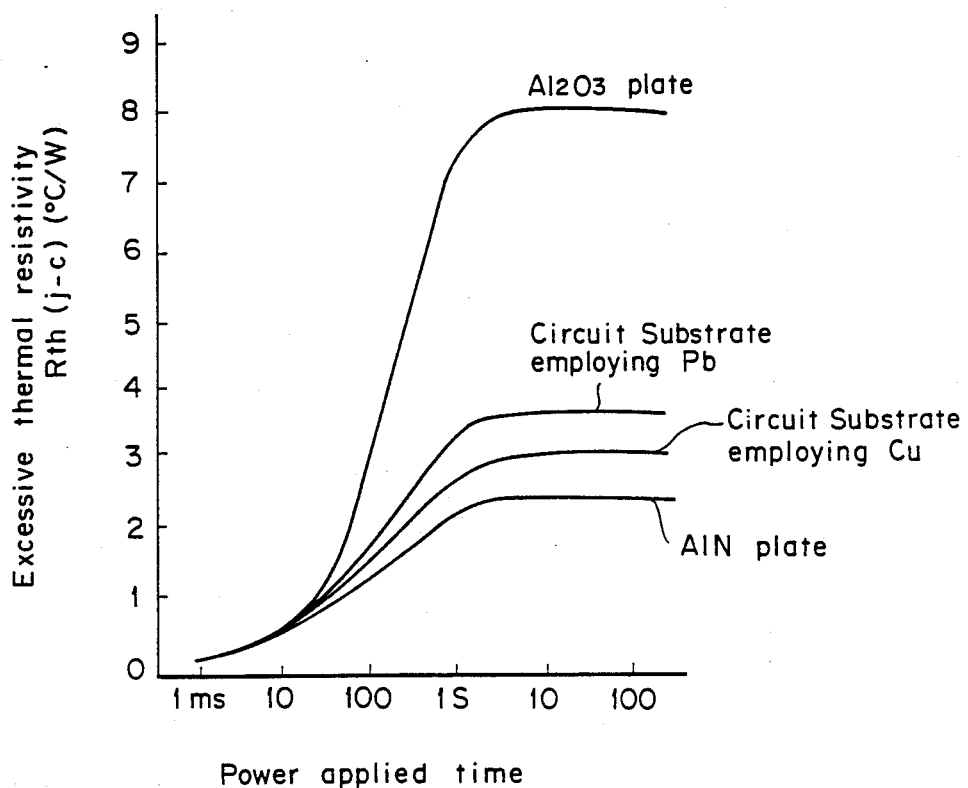
FIG. 6 represents an excessive thermal resistivity curve of the circuit substrates.

The same packages as in Example 2 were prepared except for employing a lead layer of 0.3 mm in thickness having a thermal conductivity of 35 W/m·k or a copper layer of 0.3 mm in thickness having a thermal resistivity of 350 W/m·k as a metallic material. To the above two packages, an excessive thermal resistivity was measured. The results are shown in FIG. 6 in which excessive thermal resistivity curves of Al$_2$O$_3$ and AlN are indicated for reference. As will be clear from FIG. 6, the excessive thermal resistivity curve of the package using copper layer as a metallic material is near to that of AlN to prove the excellent heat release value.

EXAMPLE 3

The same packages were prepared in the same manner as in Example 2 except for forming a metallized layer of a Mo-TiN alloy (the ratio of Mo:TiN is 2:1) on the AlN plate at a temperature of 1,700° C. in an atmosphere of nitrogen for 1 hour, a nickel electro-plating of 3 μm in thickness thereon and a metallized layer of Mo-Mn alloy containing 8% of Mn on the Al$_2$O$_3$ plate and employing a copper buffering layer of 0.3 mm in thickness.

On the other hand, the same packages were prepared as in the above except for employing a Mo-Mn alloy containing 8 of Mn as a metallized layer on the AlN plate.

There was no difference between these packages in appearance. However, a tensile strength of the package employing the Mo-Mn alloy as a metallized layer on the AlN plate was as little as about 1 kg·f/mm$^2$ and all the packages employing the Mo-Mn alloy were revealed to cause generation of cracks or peeling off at the metallized layer after 200 cycles of TCT as conducted in Example 2.

As will be clear from the above-mentioned, since the circuit substrate of this invention is constructed by combining Al$_2$O$_3$ and AlN plates, the circuit substrate of this invention is sufficient in heat dissipating effect and reduced in cost. Also, since the buffering layer is interposed at the bonded portion of Al$_2$O$_3$ and AlN plates, if the temperature of the bonded portion rises during use, the generation of cracks, etc. is inhibited to provide extreme reliability. Accordingly, the industrial value is very large.

We claim:

1. A circuit substrate comprising:
   an alumina plate comprising a bonding surface;
   an aluminum nitride plate comprising a bonding surface;
   metallized layers formed on the respective bonding surface of said alumina plate and said aluminum nitride plate; and
   a buffering layer provided between said metallized layers, said buffering layer being of a metallic material
   (a) which undergoes plastic deformation by recrystallization at a temperature of not higher than 500° C.,
   (b) which has a tensile strength of not higher than 35 kg·f/mm$^2$ at a temperature of 500° C., and
   (c) which has an elongation of not less than 10% at a temperature of 500° C.

2. The circuit substrate according to claim 1, wherein said metallic material has a thermal conductivity of not less than 50 W/m·k.

3. The circuit substrate according to claim 1, wherein said metallic material has a thermal expansion coefficient of $2 \times 10^{-6}$ to $9 \times 10^{-6}/°C$.

4. The circuit substrate according to claim 3, wherein said metallic material has a thermal expansion coefficient of $4 \times 10^{-6}$ to $7 \times 10^{-6}/°C$.

5. The circuit substrate according to claim 4, wherein said metallic material has a thermal expansion coefficient of $4 \times 10^{-6}$ to $7 \times 10^{-6}/°C$.

6. The circuit substrate according to claim 1, wherein the thickness of the buffering layer is in the range of more than 0.1 mm and less than 1.0 mm.

7. The circuit substrate according to claim 6, wherein the thickness of the buffering layer is in the range of 0.1 to 0.5 mm.

8. The circuit substrate according to claim 7, wherein the thickness of the buffering layer is in the range of 0.2 to 0.4 mm.

9. The circuit substrate according to claim 8, wherein the thickness of the buffering layer is substantially 0.3 mm.

10. The circuit substrate according to claim 1, wherein the metallic material is at least one selected from the group consisting of a nickel series alloy, a chromium series alloy, a copper series alloy, copper, a clad metal of an iron-nickel-cobalt alloy for hermetic sealing and copper, a Mo-Cu clad metal and a W-Cu clad metal.

11. The aluminum nitride circuit substrate according to claim 1, wherein said metallized layer are conductive metallized layers containing:

(i) at least one element selected from the first group consisting of molybdenum, tungsten and tantalum; and (ii) at least one element selected from the second group consisting of IIb group element, IIIa and IIIb group elements, IVb group elements, and rare-earth elements in periodic law table.

12. The aluminum nitride circuit substrate according to claim 11, wherein said second group consists of said IIb group elements.

13. The aluminum nitride circuit substrate according to claim 11, wherein said second group consists of said IIIa and IIIb group elements.

14. The aluminum nitride circuit substrate according to claim 11, wherein said second group consists of said rare earth group elements.

15. The aluminum nitride circuit substrate according to claim 11, wherein said second group consists of said IVb group elements.

16. The aluminum nitride circuit substrate according to claim 11, wherein component (ii) is selected from the group consisting of Al, Ti, Zr, Hf, Y, Ce, Dy, Th and Sm.

17. The aluminum nitride circuit substrate according to claim 1, wherein the surface of said substrate comprises aluminum nitride portions and alumina portions.

18. The aluminum nitride circuit substrate according to claim 17, wherein said aluminum nitride portions are positioned at those locations requiring greater heat dissipating properties.

* * * * *